US010439319B2

(12) United States Patent
Tucker

(10) Patent No.: US 10,439,319 B2
(45) Date of Patent: Oct. 8, 2019

(54) CONNECTOR PART OF A SUBSEA CONNECTOR

(71) Applicant: Siemens Aktiengesellschaft, Munich (DE)

(72) Inventor: David Michael Tucker, Millom (GB)

(73) Assignee: Siemens Aktiengesellschaft, Munich (DE)

( * ) Notice: Subject to any disclaimer, the term of this patent is extended or adjusted under 35 U.S.C. 154(b) by 292 days.

(21) Appl. No.: 15/344,818

(22) Filed: Nov. 7, 2016

(65) Prior Publication Data

US 2017/0141511 A1 May 18, 2017

(30) Foreign Application Priority Data

Nov. 16, 2015 (EP) .................................... 15194707

(51) Int. Cl.
*B23P 19/00* (2006.01)
*H05K 13/04* (2006.01)
*H01R 13/52* (2006.01)
*H01R 13/523* (2006.01)
*H01R 43/26* (2006.01)

(52) U.S. Cl.
CPC ....... *H01R 13/5227* (2013.01); *H01R 13/523* (2013.01); *H01R 43/26* (2013.01)

(58) Field of Classification Search
CPC .. H01R 13/5227; H01R 43/26; H01R 13/523; G02B 6/3816; G02B 6/3817; G02B 6/3869; Y10S 439/936
USPC .................................. 439/190, 248; 385/53
See application file for complete search history.

(56) References Cited

U.S. PATENT DOCUMENTS 6,929,404 B2 8/2005 Jones et al.
8,827,570 B2 9/2014 Lagathu et al.
2012/0033916 A1 2/2012 Lagathu et al.
(Continued)

FOREIGN PATENT DOCUMENTS

EP 2520757 A2 11/2012
EP 2853680 A1 4/2015
(Continued)

OTHER PUBLICATIONS

EP Search Report dated Apr. 29, 2016, for EP application No. 15194707.4.

*Primary Examiner* — Paul D Kim
(74) *Attorney, Agent, or Firm* — Beusse Wolter Sanks & Maire

(57) ABSTRACT

A connector part of a subsea connector adapted to be mated with a second part of the subsea connector by application of a mating force. The connector part has at least a first contact configured for engagement with a respective second contact of the second connector part for establishing a connection. The connector part further includes a flushing mechanism having a chamber filled with a medium and one or more fluid passages providing a flow connection from the chamber to an area adjacent to the first contact. During mating of the first connector part with the second connector part, the flushing mechanism is actuated by the mating force and medium is expelled from the chamber and is directed towards at least one of the first contact or the second contact so as to flush the first contact or the second contact, respectively, during mating.

16 Claims, 7 Drawing Sheets

(56) References Cited

U.S. PATENT DOCUMENTS

| | | | | |
|---|---|---|---|---|
| 2016/0246012 | A1* | 8/2016 | Burrow | E21B 33/0385 |
| 2017/0005448 | A1* | 1/2017 | Williams | H01R 43/005 |

FOREIGN PATENT DOCUMENTS

| | | | |
|---|---|---|---|
| GB | 2394127 | A | 4/2004 |
| GB | 2402560 | A | 12/2004 |

* cited by examiner

CONNECTOR PART OF A SUBSEA CONNECTOR

CROSS REFERENCE TO RELATED APPLICATIONS

This application claims the benefit of European Application No. EP15194707 filed 16 Nov. 2015, incorporated by reference herein in its entirety.

FIELD OF THE INVENTION

The invention relates to a connector part of a subsea connector adapted to be mated with a second part of the subsea connector by application of a mating force, and to a method of flushing a contact of a subsea connector.

BACKGROUND

Several applications are known in which connections need to be provided underwater, such as electrical connections and/or optical connections. Examples include a subsea installation for the production of hydrocarbons from a subsea well, in which different components of the subsea installation may need to be connected for power transfer and/or data communication. Such connections may for example comprise a connection from a topside installation, such as a floating or fixed platform, or from an onshore site, to a subsea component, for example by means of an umbilical or a subsea cable. Other connections include electrical connections between different type of subsea equipment, such as a connection between a subsea transformer and subsea switchgear, a data connection between different control modules or between a hub and a satellite well. In some configurations, a data connection may need to be provided over increased distances, for example between two subsea wells that are more than 1 km apart, for which purpose an optical data connection is particularly beneficial, in particular when making use of an Ethernet data connection.

For providing an underwater connection, wet-mateable connectors are known which can be mated underwater. Although such type of connectors is generally more complex than corresponding dry-mate connectors, which have to be mated above the water surface, wet-mateable connectors have several advantages. Components of the subsea installation can for example be disconnected and can be retrieved for servicing or exchange, additional components may be connected to an existing subsea installation, connections can be provided to a subsea structure after installation thereof on the ocean floor, and the like.

When establishing a connection subsea, a first connector part, for example a plug part, is engaged with a second connector part, for example a receptacle part. Due to the large water depth, this is generally done by making use of a remotely operated vehicle (ROV), which for example holds one connector part and engages it with the other connector part. During the engagement, friction between moving connector parts may generate microscopic particles that become immersed in a fluid filling a connector part. Such particle can settle on an optical contact of the connector part, thereby causing high optical losses upon full engagement of the first and second connector parts. This can result in a reduced performance of the connector or in total failure of the connector. To remove such failure, the connector needs to be brought up to the surface where it is replaced or serviced. This results in high costs (for example due to the enormous costs associated with operating an offshore vessel that is capable of performing such replacement) and further in a significant delay.

It is desirable to improve the reliability of the mating of such connectors in a subsea environment, and in particular to ensure that a connection having the desired performance can be established. It should be avoided that the connector needs to be brought up to the surface to establish a reliable connection. It is desirable to avoid a reduced quality of such connection in fiber optical connectors, which may be caused by particles or other impurities that have settled on the optical contact surfaces.

SUMMARY

Accordingly, there is a need to improve the mating of subsea connectors, and in particular to ensure that a reliable connection can be established by such subsea connector at a subsea location.

This need is met by the features of the independent claims. The dependent claims describe embodiments of the invention.

According to an embodiment of the invention, a connector part of a subsea connector adapted to be mated with a second part of the subsea connector by application of a mating force is provided. The connector part comprises at least a first contact configured for engagement with a respective second contact of the second connector part for establishing a connection. The connector part further comprises a flushing mechanism that includes a chamber filled with a medium and one or more fluid passages that provide a flow connection from the chamber to an area adjacent to the first contact. The flushing mechanism is configured such that during mating of the first connector part with the second connector part, the flushing mechanism is actuated by the mating force and medium is expelled from the chamber and is directed towards the first contact and/or the second contact so as to flush the first contact and/or the second contact, respectively, during mating.

By means of such flushing mechanism, it may be possible to remove a particle or the like that has settled on the first or second contact, in particular an optical contact, so that a connection that does not suffer from reduced performance can be established. Since the flushing mechanism is actuated by the mating force, no additional external equipment is necessary for providing the flushing. A more efficient and less complex subsea connector may thus be achieved. Even further, by making use of the mating force to actuate the flushing mechanism, a repeated flushing may be achieved by simply repeatedly mating and de-mating the connector part and the second connector part. Accordingly, if the first mating does not achieve a clean contact and a connection without reduced performance, this may be achieved by subsequent mating steps, thus allowing a reliable connection without the need to bring the subsea connector to the topside for servicing. As a result, the costs of recovering a connector that performs poorly may be prevented. The connector part is herein also termed 'first connector part'.

In an embodiment, the flushing mechanism is an internal flushing mechanism that is completely comprised within the connector part, in particular within a connector housing of the connector part. A compact configuration with reduced complexity may be achieved.

In an embodiment, the flushing mechanism comprises a piston that is arranged to be moveable into the chamber during operation of the flushing mechanism so as to displace medium from within the chamber. As an example, the chamber may have a predetermined volume, and as the piston moves into the chamber, the volume is reduced, thus forcing medium out of the chamber through the one or more fluid passages. Accordingly the medium is expelled through the one more fluid passages. The flushing mechanism can thus be kept relatively simple while a relatively strong movement of the medium over the first and/or second contact, for example over the face of an optical fiber or a fiber ferrule may be achieved.

The connector part may comprise a shuttle pin, and the piston may be configured to be engaged by the shuttle pin, or the shuttle pin itself may provide the piston.

In an embodiment, the flushing mechanism may comprise a piston and a body enclosing the chamber, wherein the one or more fluid passages are provided in the piston, in the body or both. The piston may comprise at least part of the fluid passage.

In an embodiment, the force for expelling medium from the chamber is directly or indirectly provided by the mating force which is applied to the connector part and/or the second connector part during mating. Accordingly, the flushing mechanism does not need to comprise any active components that generate such force, or does not require any external pumping or suction components.

The one or more fluid passages may be arranged such that at least one fluid passage expels the medium in a direction that is substantially perpendicular to an axial direction of the connector part. The flow of medium may thus be directed at the first and/or second contacts and furthermore, a relatively strong movement of the medium may be achieved.

The one or more fluid passages may be arranged such that the medium is expelled in a radially outwardly direction from a central axis of the connector part. In particular, the first and second contacts may be located off the central axes of the connector part when they are engaged, and one or both contacts may be flushed at this off central position by means of the flushing mechanism.

The connector part may comprise a connector housing filled with the medium. The medium may be allowed to circulate in the connector housing. In particular, the medium may circulate during actuation of the flushing mechanism. There may in particular be no exchange of medium during the flushing operation. In such configuration, no tank or reservoir for new medium and for used medium are required, enabling are compact design of the connector part. Nevertheless, the flushing action provided by the flushing mechanism may achieve a reliable cleaning of the contact since the flushing operation may be repeated by repeated mating and de-mating cycles, as outlined above.

The flushing mechanism may in particular be configured such that upon de-mating of the connector part and the second connector part, medium reenters the chamber through the one or more fluid passages.

In an embodiment, the connector part includes a connector housing in which the flushing mechanism is arranged. The connector housing is filled with a pressure compensation medium and is pressure compensated against a surrounding environment, wherein the medium that is expelled from the chamber is the pressure compensation medium. The surrounding environment is the subsea environment when the connector part is installed subsea. The connector part may for example comprise a pressure compensator in form of one or more or a combination of a membrane, a bladder and a bellows. Furthermore, such pressure compensator may take up the volume of medium that is displaced from the chamber of the flushing mechanism during the mating of the first and second connector parts, in particular the volume of medium that is displaced when a pin of the second connector part enters the connector housing of the first connector part.

The medium may be a dielectric liquid or gel.

In an embodiment, the flushing mechanism comprises a piston and a body enclosing the chamber. It furthermore comprises a flushing mechanism spring that is arranged to apply a spring force that counteracts a movement of the piston into the body. The volume of the chamber may thus be restored by the spring urging the piston out of the chamber upon de-mating of the connector part and the second connector part.

The first contact may be mounted to the body of the flushing mechanism.

In an embodiment, the body and piston of the flushing mechanism may form a damper unit that delays the engagement of the first contact with the second contact during the mating of the first and second connector parts. By delaying the engagement, a more reliable engagement between the first and second contacts may be achieved since the speed of the engagement is independent of the mating speed of the first and second connector parts, which is controlled by the ROV (remotely operated vehicle) pilot that performs the mating by means of the ROV.

The body may be moveable in the connector part between a first position in which the first contact engages the second contact when the connector part and the second connector part are in the mated state, and a second position in which the first contact is spaced apart from the second contact when the connector part and the second connector part are in the mated state. The flushing mechanism may further comprise a first spring that is mechanically connected to the body so as to urge the body into the first position.

The flushing mechanism may be configured such that during mating, the body and piston are displaced towards the second position by the mating force against the force of the first spring. Accordingly, the engagement of the first and second contacts may be delayed, since in the second position, the first contact does not engage the second contact. In the second position, the first spring may urge the body forwardly towards on the piston and towards the first position against the force of the flushing mechanism spring. Thereby, the volume of the chamber is decreased (due to the piston entering the body) and medium is expelled through the one or more flow passages.

The piston may for example be held and displaced by the shuttle pin, which is pushed into the connector housing by a pin of the second connector part. The spring force of the first spring may be larger than the spring force of the flushing mechanism spring (which may also be termed second spring). The first spring can thus urge the body of the flushing mechanism forwardly against the force of the second spring, wherein said movement of the body is delayed by the medium leaving the chamber through the one or more fluid passages.

The one or more fluid passages may be dimensioned such that the flow of medium out of the chamber is restricted so as to delay the movement of the body towards the first position by the force applied by the first spring. Engagement of the contacts at controlled speed can thus be achieved.

The connector part may comprise a connector housing having an opening for allowing a pin of the second connector part to enter the connector part. It may further comprise a shuttle pin that is disposed in the opening and sealed against the housing in an unmated state of the connector part. The shuttle pin may be moveable rearwardly into the connector housing to activate the flushing mechanism during mating.

The shuttle pin is for example moved rearwardly into the connector housing by the application of the mating force by the pin of the second connector part. The connector part may furthermore comprise the respective seal for providing a sealing between the shuttle pin and the connector housing.

The shuttle piston may be moveable along a central axis of the connector part. The first contact may be positioned at a position that is radially displaced from the central axis and that allows the shuttle pin to travel towards an axial position at which it at least partly overlaps the first contact (i.e. overlapping in radial direction). In such configuration, an optical connector with a compact design may be achieved.

The shuttle pin may comprise at least a part of the one or more flow passages.

The one or more flow passages may comprise at least two or more bores in radial direction in the shuttle pin and a supply channel in the shuttle pin that is in flow connection with the two or more bores. A flow connection between the supply channel in the shuttle pin and the chamber of the flushing mechanism may be established during the mating of the connector part with the second connector part. Such flow connection may extend directly into the chamber, or indirectly, for example via a flow channel in a piston that forms part of the flushing mechanism.

In an embodiment, the connector is an optical connector. The first contact may be an optical contact, for example a ferrule comprising one or more optical fibers. In particular, it may be an MT-ferrule. Similarly, the second contact may be an optical contact that is configured to engage the first contact.

A further embodiment provides a method of flushing a contact in a subsea connector, wherein the subsea connector comprises a first connector part having a first contact and a second connector part having a second contact, and wherein the first connector part comprises a flushing mechanism that includes a chamber filled with medium and one or more fluid passages providing a flow connection from the chamber to an area adjacent to the first contact. The method comprises the steps of mating the first connector part with the second connector part for engaging the first contact with the second contact for establishing a connection, wherein the mating occurs with a mating force. It further comprises actuating the flushing mechanism by the mating force, thereby expelling medium from the chamber. The medium is directed towards at least one of the first contact or the second contact so as to flush the first contact or the second contact, respectively, during mating.

By means of such method, advantages similar to the ones outlined further above may be achieved. The connector part employed in the method may have any of the above outlined configurations. Furthermore, the method may comprise any of the steps described further above with respect to the connector part.

It is to be understood that the features mentioned above and those yet to be explained below can be used not only in the respective combinations indicated, but also in other combinations or in isolation, without leaving the scope of the present invention.

BRIEF DESCRIPTION OF THE DRAWINGS

The forgoing and other features and advantages of the invention will become further apparent from the following detailed description read in conjunction with the accompanying drawings. In the drawings, like reference numerals refer to like elements.

DETAILED DESCRIPTION

Figure 1:
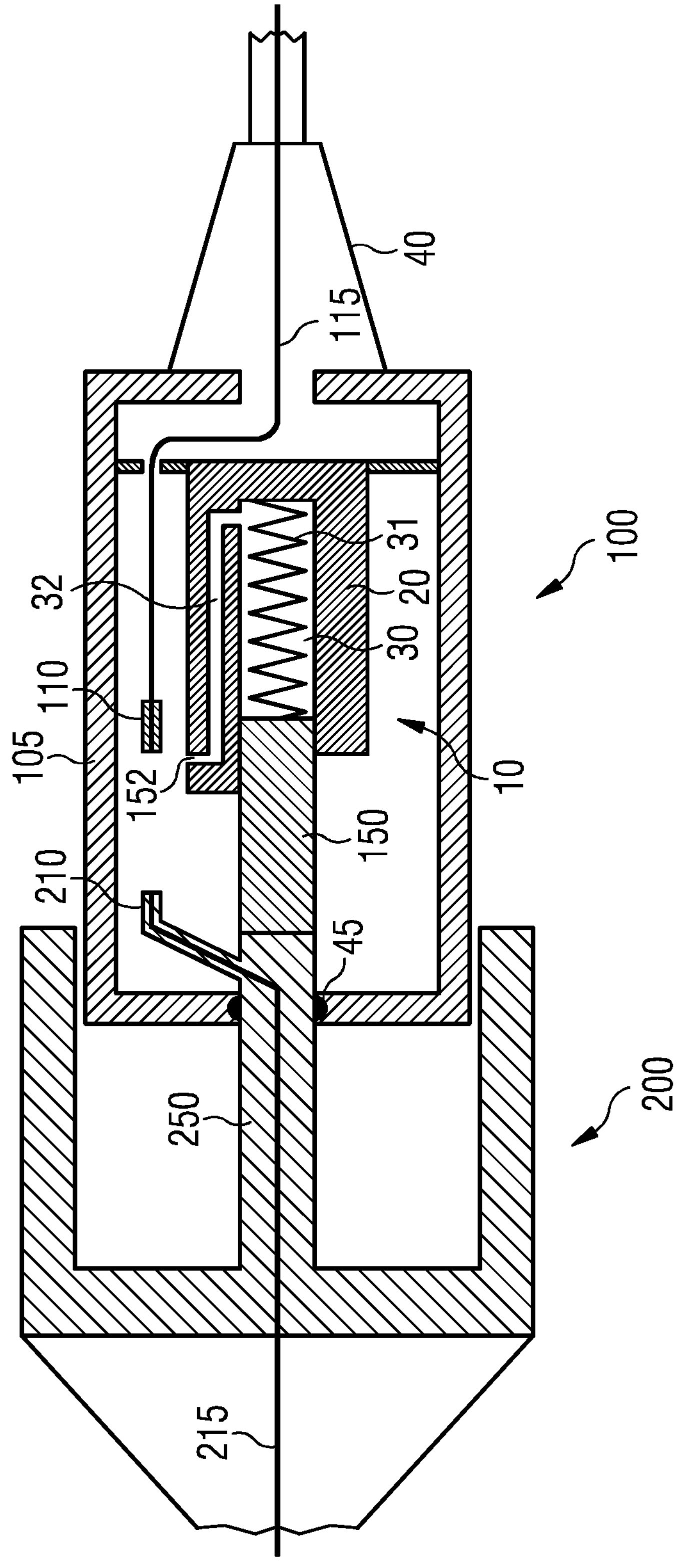
FIG. 1 is a schematic drawing showing a connector part according to an embodiment of the invention.

In the following, embodiments illustrated in the accompanying drawings are described in more detail. It should be clear that the following description is only illustrative and non-restrictive. The drawings are only schematic representations, and elements in the drawings are not necessarily to scale with each other. In some embodiments, the elements illustrated in the drawings of FIGS. 1-7 may be to scale with each other as shown in these drawings.

FIG. 1 illustrates a connector part 100 according to an embodiment of the invention. The connector part 100 may also be termed first connector part. The connector part 100 includes the connector housing 105, which can be composed of multiple parts, although only a single part housing is shown for the purpose of illustration in FIG. 1. Furthermore, a contact 110 is provided for engagement with a corresponding second contact 210 of the second connector part 200. The first and second connector parts 100, 200 are part of a wet-mateable subsea connector and are configured to be mated under water, for example in a depth of more than 1000 m.

In the example of FIG. 1, the first contact 110 is provided by an optical contact, in particular by a fiber ferrule that includes one or more optical fibers. The connection 115 leads one or more optical fibers to the contact 110. The subsequent description is based on a fiber optical connector employing a fiber ferrule as a first contact 110. Nevertheless, it should be clear that embodiments of the invention may also be used with other types of contacts 110, for example a single or multiple optical contact, or an electrical contact, or a hybrid contact comprising electrical and optical contacts. Connection 115 may thus accordingly being optical line, an electrical line, or two lines, for example optical and electrical lines may be provided.

The second contact 210 is a complementary optical contact that can form a through-going optical connection together with the first contact 110. Second contact 210 is connected via the line 215 which again can include one or more optical fibers, in particular a fiber ribbon.

The first connector part 100 further includes a shuttle pin 150 that seals an opening in the connector housing on 105 in the unmated state. FIG. 1 shows a state during mating in which a pin 250 of the second connector part 200 has already entered the connector housing 105 and pushed the shuttle pin 150 rearwardly into the connector housing 105. A seal 45 is provided that seals against the shuttle pin 150 in the de-mated state so that water is prevented from entering the connector housing 105. When shuttle pin 150 is pushed rearwardly, the sealing then passes from the shuttle pin 150 to the pin 250, as illustrated in FIG. 1. When the pin 250 has entered the connector housing 105, the second contact 210 may be deployed from within the pin 250, for example as described in the document U.S. Pat. No. 6,929,404 B2, the contents of which is incorporated herein by reference in its entirety.

As can be seen, the engagement between the first and second contacts 110, 210 occurs off the central longitudinal axes of the first connector part 100.

The first connector part 100 further includes a flushing mechanism 10. In the embodiment of FIG. 1, the flushing mechanism 10 has a body 20 that encloses a chamber 30. It further includes one or more fluid passages 32, or channels, that provide a flow connection from within the chamber 30 to an area adjacent to the first contact 110. Although, only one fluid passage 32 is shown in FIG. 1, multiple fluid passages may be provided. The location of the fluid passages is not limited to the body of the chamber and fluid passages may be provided in other elements, such as the shuttle pin 150, or piston.

The shuttle pin 150 acts in the embodiment of FIG. 1 as a piston and may thus be considered to form part of the flushing mechanism 10. During the mating of the first and second connector parts 100, 200, the pin 250 pushes the shuttle pin 150 into the chamber 30, whereupon the volume of chamber 30 is decreased. Consequently, medium filling the chamber 30 is expelled through the fluid passage 32. The flushing mechanism 10 is configured such that the expelled fluid is directed towards the first and/or second contact 110, 210. As can be seen from FIG. 1, with progressing mating of the first and second connector parts, also the second contact 210 is moved towards a position adjacent to the exit of the fluid passage 32 so that also the second contact 210 will be flushed.

The flushing mechanism 10 essentially comprises a plunger that pushes the medium filling chamber 30 out of the chamber through the fluid passage 32, wherein the plunger may be formed by the shuttle pin 150, but may also be formed by a separate piston or another suitable element. A spring 31, which is herein turned flushing mechanism spring 31, or second spring 31, is disposed in chamber 30. The second spring 31 urges the shuttle pin 150 or any other type or piston or plunger that may be used with the flushing mechanism 10 out of the chamber 30. Accordingly, when the first and second connector parts are de-mated, medium flows back into chamber 30 and the shuttle pin 150 returns to its original position in which it seals the opening in connector housing 105 by means of seals 45.

It should be clear that plural fluid passages 32 may be provided, and that they can also be provided in other elements, for example in the shuttle pin 150.

As can be seen, during the mating of the first and second connector parts, the mating force that is applied actuates the flushing mechanism 10 and thereby flushes the first and second contacts 110, 210. The medium that is used for flushing is medium filling the connector housing 105. The medium is allowed to circulate inside the connector housing 105 and is not pumped from a clean medium reservoir to a used medium reservoir. Accordingly, a simple configuration with relatively low complexity is achieved.

The first connector part 100 furthermore comprises a pressure compensator 40, that in the example of FIG. 1 is provided in form of a flexible cable gland that is allowed to expand and contract. This way, the pressure inside the connector housing 105 can be balanced to the pressure in the subsea environment when the connector part 100 is deployed subsea (which is also termed pressure compensation). Furthermore, when medium is displaced upon the pin 250 entering the connector housing 105, the displaced medium can be taken up in the pressure compensator 40 by a corresponding expansion of the pressure compensator. Note that the pressure compensator 40 may be more complex as illustrated in FIG. 1, it may for example comprise one or more bellows, membranes and/or bladders that can be arranged inside the connector housing 105. As an example, by making use of a bellows and a membrane, a double barrier against the sea water may be achieved.

The seal 45 is a gland seal and/or wiper seal, it may for example comprise at least one rod seal and one wiper seal.

Arranging the first and second contacts 110, 210 off the central axis of the first connector part 100 allows the use of the pin 250 and shuttle pin 150 for actuating the flushing mechanism 10 which is located centrally in the connector part 100. A relatively simple and effective flushing mechanism can thus be realized.

The flushing mechanism 10 includes ports or bores 152 that form part of the fluid passage 32. As can be seen, these bores 152 extend in a direction that is aimed towards the first and/or second contact 110, 210. The bore 152 may for example extend substantially perpendicular to the central axial direction of the connector part 100. It may in particular extend in radial direction of the connector part 100 as shown in FIG. 1.

Figure 2:
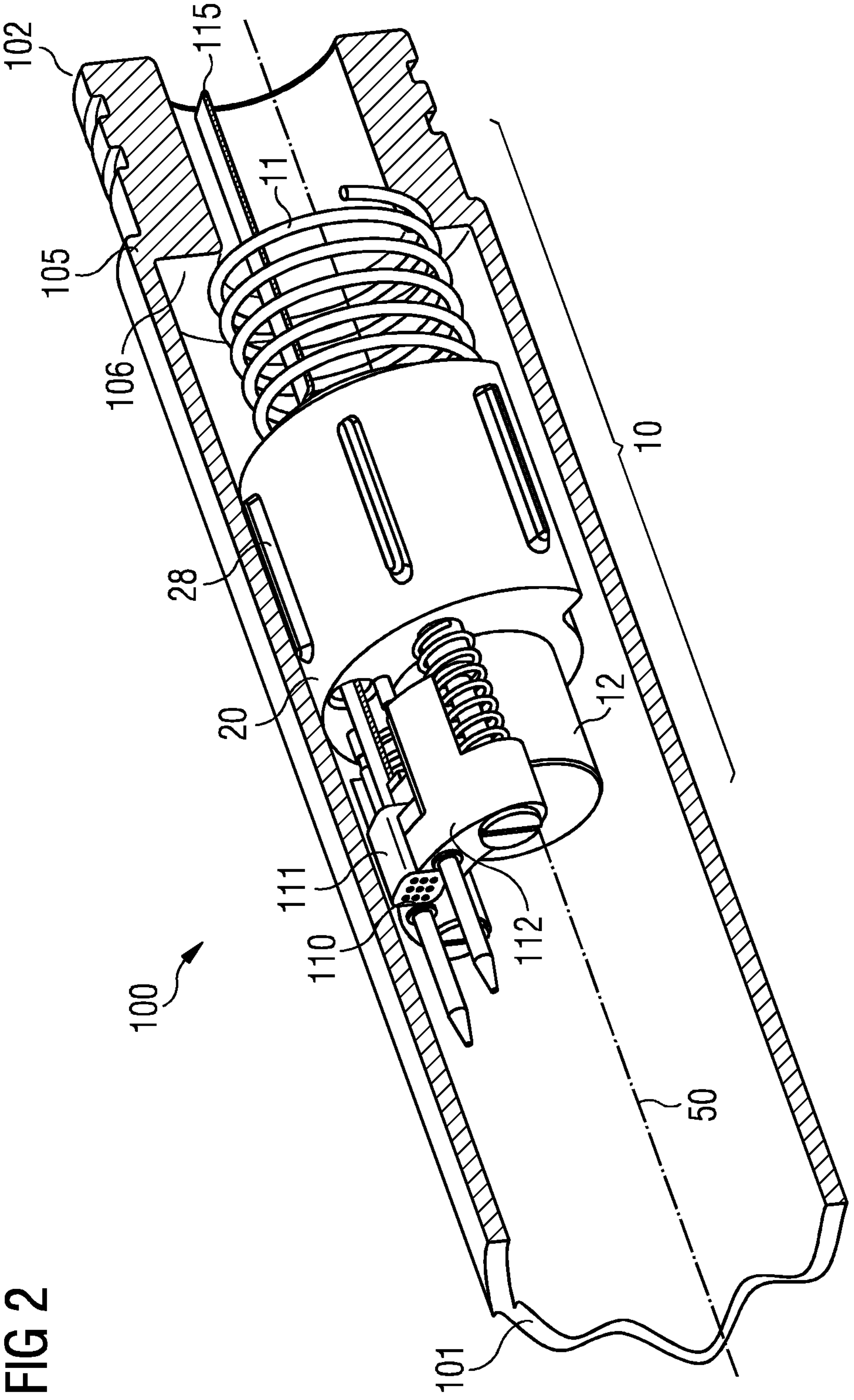
FIG. 2 is a schematic drawing showing a connector part according to an embodiment of the invention.

FIG. 2 illustrates a further embodiment of the connector part 100. The above explanations are equally applicable to the embodiment of FIG. 2. In the connector part 100 of FIG. 2, the flushing mechanism 10 furthermore implements a damper unit. The damper unit is provided for delaying the engagement of the first contact 110 with the second contact 210 when the connector part 100 is mated with the second connector part. In particular, the damper unit moves the contact 110 out of the way, i.e. away from the first position illustrated in FIG. 2, so that upon mating of the connector part 100 with the second connector part 200, the contact 110 does not engage the second contact 210. Furthermore, the flushing mechanism 10 that implements the damper unit is configured to subsequently move the contact 110 into engagement with the second contact 210 at a controlled speed. This way, the engagement speed of the first contact 110 and the second contact 210 can be decoupled from the mating speed of the connector part 100 with the second connector part 200.

Note that FIG. 1 only shows a fraction of the first connector part 100. The first connector part 100 has a forward end 101 at which the second connector part 200 engages the first connector part. It further has rearward end 102, where the connector part 100 is for example connected to a cable, i.e. it may comprise a cable termination, or may be mounted to a stab plate or an enclosure wall or the like. The connector part extends along the central axis 50 between the forward end 101 and the rearward end 102.

The flushing mechanism 10 includes a body 20 and a first spring 11. The first spring 11 bears on one side against a rearward end of the body 20, and at its other side against the connector housing 105 of connector part 100. As an example, it may bear against a shoulder 106 of the housing 105. It should be clear that in other configurations, it may also bear against another part of the housing, either directly or indirectly, e.g. via another component that is mounted to the housing 105, so that the force applied by the spring is transferred to the housing 105.

The flushing mechanism 10 furthermore includes the piston 12 that is moveable into the body 20. The contact 110 is mounted to the body 20. The first contact 110 includes the ferrule 111, in particular an MT ferrule. The body 20 is moveable along the axial direction 50 together with the contact 110, which is explained in more detail further below. As shown in FIG. 2, the contact 110 does not need to be fixedly mounted to the body 20. Rather, the contact 110 may include further elements that ensure a smooth engagement of the first contact 110 with the second contact. In the present example, these include pins and springs so that a certain compliance is provided. Furthermore, the mount for the contact 110 includes guide pins which guide the contact 110 and the second contact into the engaged position. By providing a certain degree of flexibility, it can be ensured that the first and second contacts are properly aligned. Nevertheless, it can be seen from FIG. 2 that if the body 20 is moved, the contact 110 and its mount move together with the body 20.

The flushing mechanism 10, or at least parts of it, are provided in a chamber of the housing 105 that is filled with a medium, preferably a pressure compensation medium, in particular a liquid, such as a dielectric liquid. As an example, the chamber may be oil filled. The body 20 includes guide elements 28, such as ridges shown in FIG. 2, which allow the body 20 to be guided along the inside of the housing 105. In particular, the body 20 can slide along the inside of the housing while liquid that is displaced during the movement of the body can pass between the inner surface of the housing 105 and the body 20, since the guide elements 28 cause a certain spacing between the body 20 and the housing 105.

Figure 3:
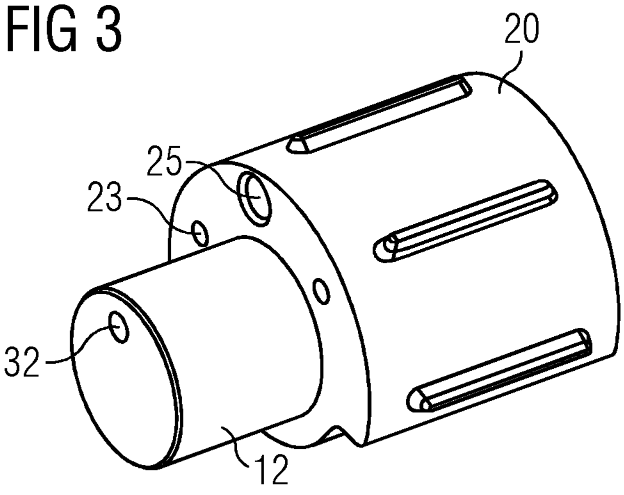
FIG. 3 is a schematic drawing showing a perspective view of a part of a flushing mechanism of the connector part of FIG. 2.

FIG. 3 is a schematic drawing showing the body 20 and the piston 12 in more detail. The body 20 includes a through hole 25 through which an electrical and/or fiber optical connection for contacting the first contact 110 can be led. Furthermore, mounting holes 23 are provided for mounting the first contact 110 to the body 20, in particular by means of the mount 112 shown in FIG. 2.

Figure 4:
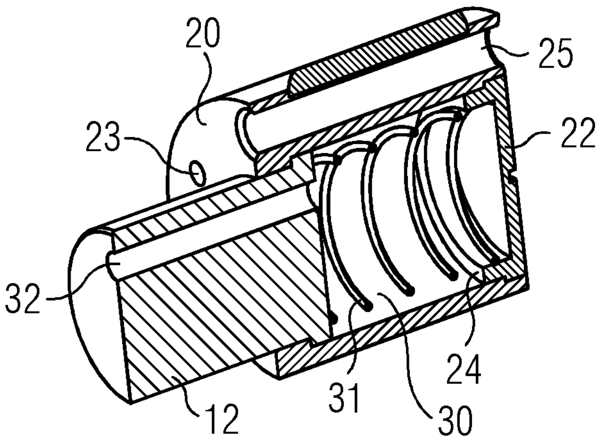
FIG. 4 is a schematic drawing showing a sectional perspective view of the part of the flushing mechanism of FIG. 3.

In FIG. 4, which is a sectional perspective view of a part of the flushing mechanism 10, the interior of the body 20 can be seen. Inside the body 20, a chamber 30 is provided. The piston 12 can move into the chamber 30 against the force of the second spring 31 that urges the piston towards its extended position that is illustrated in FIG. 4. Spring 31 bears on one side against the rearward wall 22 of body 20 and on its other side against the piston 12. As can be seen, the piston 12 is at its rearward end provided with a protrusion so that it cannot be separated from the body 20. Furthermore, the chamber 30 includes at least part of the fluid passage 32 that in the present example is provided in form of a flow channel through the piston 12. It should be clear that in other configurations, the fluid passage 32 may be provided at different positions, for example in form of an opening or aperture in the body 20 as shown in FIG. 1.

In the configuration of FIG. 4, the body 20 can be moved relative to the piston 12. If such movement occurs, a fluid, in particular a liquid filling the chamber 30 is expelled through the fluid passage 32, since the volume of chamber 30 is reduced. Since the opening 32 constitutes a flow restriction, movement of the piston 12 into the body 20 is damped. The time required by the piston 12 to fully move into a final position in which it abuts the abutment face 24 inside the chamber 30 is determined by the amount of force applied to the piston 12 or to the body 20, and the dimension of the fluid passage 32, as well as the viscosity of the fluid or liquid filling the chamber 30. Accordingly, it is possible to adjust the speed with which the body 20 moves relative to the piston 12 by adjusting any of these parameters.

In consequence, since the body 20 is allowed to move relative to the housing 105, the speed of movement of the body 20 and thus of the first contact 110 mounted thereto can be adjusted by these parameters. Accordingly, the engagement speed of the first contact 110 with the second contact can be adjusted and controlled independent of the mating speed of the first and second connector parts.

Figure 5:
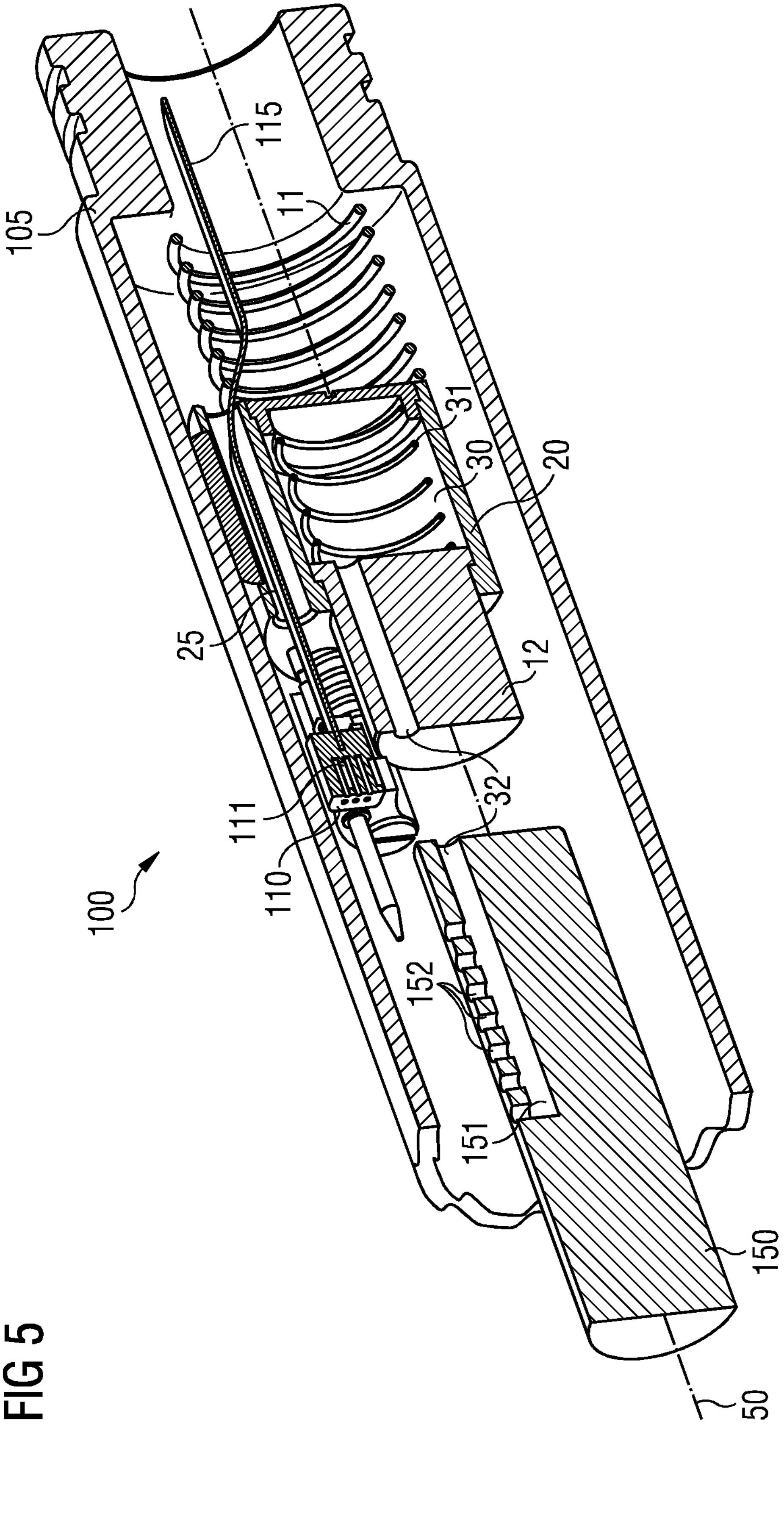
FIG. 5 is a schematic drawing showing a sectional perspective view of the connector part of FIG. 2 in a de-mated state.

FIG. 5 shows the connector part 100 of FIG. 2 in the unmated state in a perspective sectional view. In the unmated state, the first spring 11 pushes the body 20 forwardly into a first position. Accordingly, also the contact 110 is located in a first position. Furthermore, the second spring 31 inside the body 20 pushes the piston 12 forwardly, the spring 31 being in an extended state. In this state, the medium fills the chamber 30.

FIG. 5 furthermore illustrates the shuttle pin 150 of the first connector part 100. The shuttle pin 150 includes in the example of FIG. 5 a supply channel 151 and bores 152 which form part of the fluid connection 32. Supply channel 151 together with the flow channel in the piston 12 provide a flow connection from the chamber 30 to an area adjacent to the first contact 110 when the shuttle pin 150 engages the piston 12. In other words, the medium filling chamber 30 can thus be expelled and directed towards the contacts 110, 210 during mating.

As can be seen, the fluid passage 32 includes multiple bores 152. The bores may be arranged next to each other in a row that extends in the axial direction 50. By means of these plural bores, a flushing action can be achieved at different locations during mating, so that the first and/or second contacts 110, 210 may be flushed repeatedly when passing along the bores 152 (e.g. when the body 20 moves from the second to the first position). Other configurations of the fluid passage 32 are certainly conceivable. It may for example include further bores for flushing in the piston 12, or the bores 152 may be arranged differently on the shuttle pin 150, for example in two rows or the like.

Figure 6:
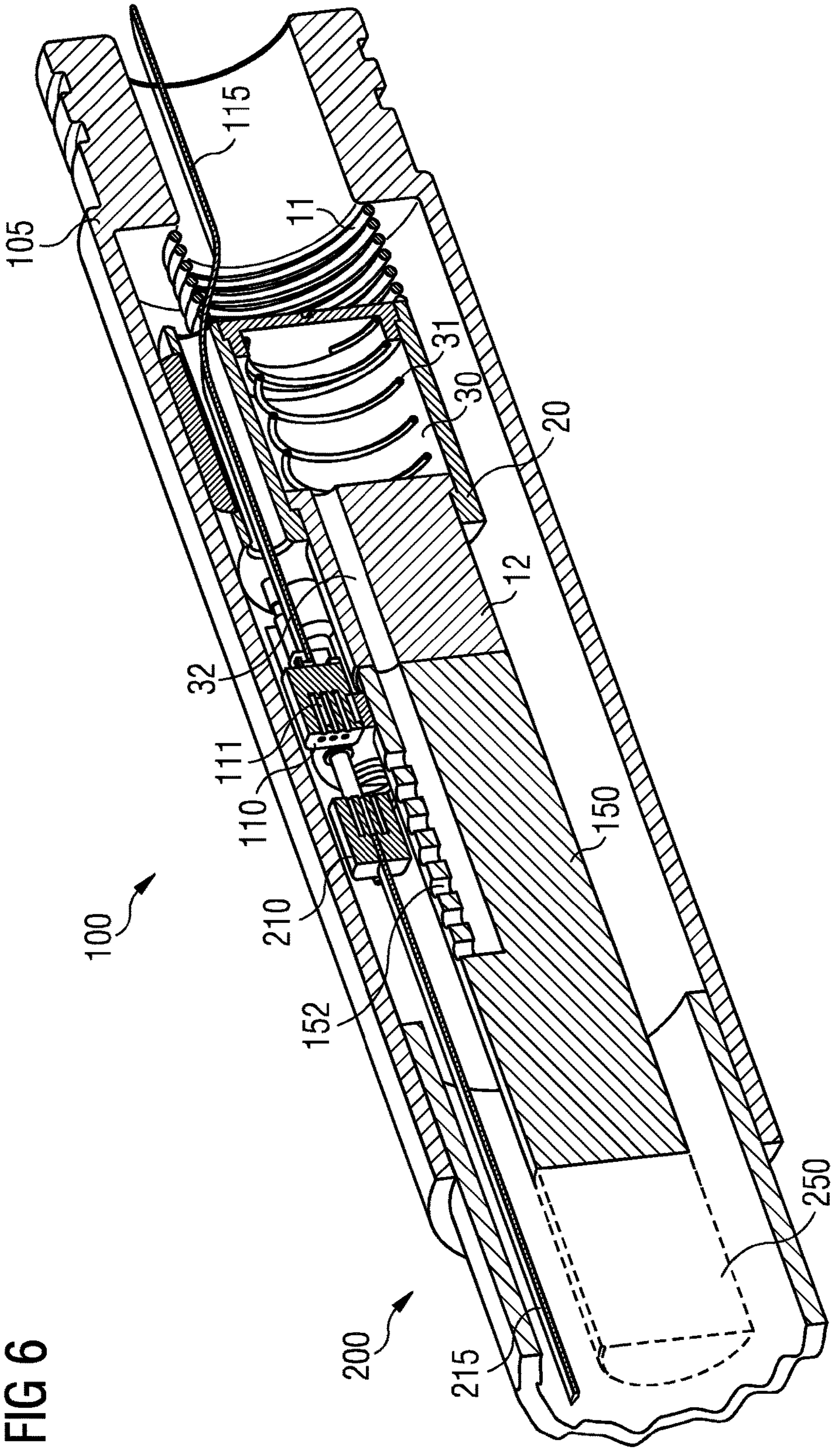
FIG. 6 is a schematic drawing showing a sectional perspective view of the connector part of FIG. 2 in a state in which the connector part is mated with a second connector part and in which the first contact is spaced apart from the second contact.

In FIG. 6, the connector part 100 is illustrated in a state in which the connector part 100 is mated with the second connector part 200, i.e. the connector parts 100 and 200 are in a mated state. Nevertheless, the state illustrated in FIG. 6 is a state that is reached directly after the first connector part 100 is mated with the second connector part 200 and the first contact 110 is not yet in engagement with the second contact 210.

During mating, the pin 250 of the second connector part 200 pushes the shuttle pin 150 rearwardly into the connector housing 105 and into engagement with the piston 12. Upon further progress of the mating, the piston 12 together with the body 20 are pushed rearwardly against the force of the first spring 11. Due to the restriction of the flow of liquid out of the chamber 30, the piston 12 remains in the extended state and does not compress the second spring 31. This situation is illustrated in FIG. 6. Although it should be clear that as soon as the shuttle pin 150 applies a force to the piston 12 in a rearward direction, the applied force will lead to liquid flowing through the opening 32 out of the chamber 30, so that compression of the spring 31 and movement of the piston 12 into the chamber 30 starts. Nevertheless, the movement is relatively slow so that there is no significant compression of the spring 31 when the first and second connector parts 100, 200 reach the mated state shown in FIG. 6.

The compressed first spring 11 now applies a force to the body 20 in a forward direction. Since the spring constant of the first spring 11 is chosen to be larger than the spring constant of the second spring 31, the body 20 is urged forwardly, wherein the forward movement is restricted by the volume of liquid that can leave the chamber 30 through the fluid passage 32. Accordingly, the speed of movement of the body 20 in forward direction can be controlled by controlling the volume of liquid that is allowed to leave the chamber 30. As outlined above, this can be achieved by controlling for example the size and number of bores 152, by controlling the dimensions of the flow channel, by controlling the viscosity of the liquid, by controlling the spring constant of spring 11 or the like.

In the state illustrated in FIG. 6, the body 20 has been moved into a second, rearward position. The first contact 110 mounted to the body 20 is thus also moved into a second, rearward position. In the second position of contact 110, the first contact 110 is spaced apart from the second contact to 210, as shown in FIG. 6. Accordingly, the first and second contacts 110, 210 are not in engagement, and no connection is established.

When the body 20 is now moved forwardly by the force applied by spring 11, the first contact 110 is also moved forwardly and thus back into the first position. This movement is indirectly effected by the mating force, since the mating force first compresses the spring 11 which in turn causes the movement. By the forward movement of body 20, contact 110 is moved into engagement with the second contact 210. During this movement, the medium is expelled from chamber 30 through the bores 152 of the fluid passage 32 and thus creates a strong movement of the medium over the mating faces of the contacts 110, 210. Particles or other impurities that might be present in the medium and may have settled on the mating faces can thus be removed by this flushing action.

Figure 7:
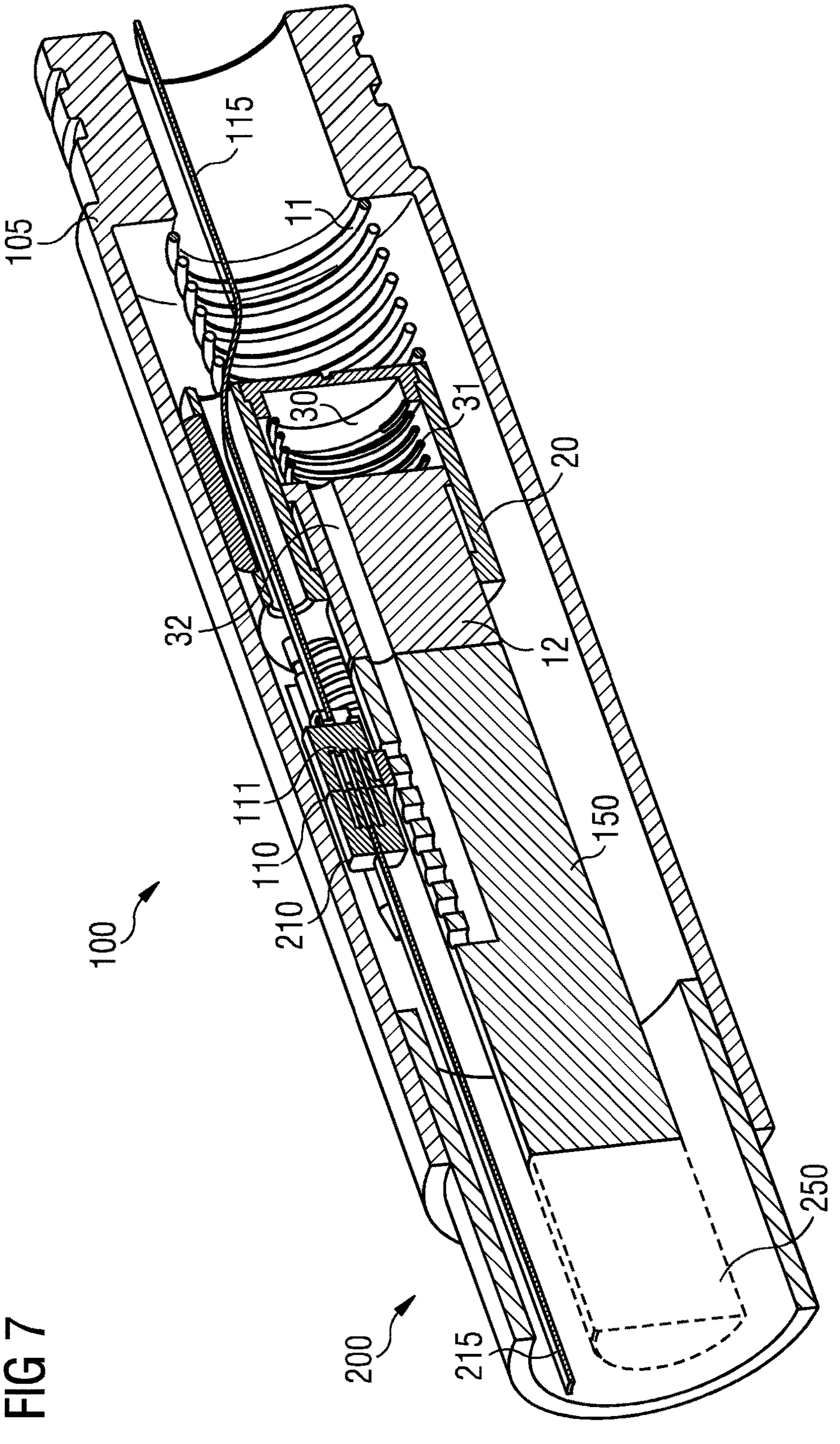
FIG. 7 is a schematic drawing showing a sectional perspective view of the connector part of FIG. 2 in a state in which the connector part is mated with a second connector part and in which the first contact is in engagement with the second contact.

FIG. 7 shows the connector part 100 of FIG. 6 in the mated state and in a state in which the first and second contacts 110, 210 are in engagement. As can be seen, the first spring 11 is now extended, whereas the second spring 31 is now compressed. The body 20 and thus the first contact 110 is now located in the first position. The first and second contacts 110, 210 are in engagement and establish a connection between the line 115 and the line 215 of the first and second connector parts 100, 200, respectively. A data connection or a connection for power transfer may thus be established. Preferably, it is a fiber optical data connection that is being established.

The subsea connector with the mated first and second connector parts 100, 200 can now remain in operation for the desired amount of time. If the connector parts are de-mated again, the first connector part 100 is moved rearwardly with respect to the second connector part 200. Accordingly, the shuttle pin 150 will move forwardly and will return into its position in the de-mated state where it seals an opening in the housing 105 of the first connector part 100. As a consequence, the piston 12 is free to move again, and will be urged forwardly by the compressed spring 31. Accordingly, liquid can flow back into the chamber 30 through the fluid passage 32. Finally, the piston 12 will reach its extended state, and the connector part 100 will thus return to the state that is illustrated in FIG. 5.

As can be seen, embodiments of the inventions provide a decoupling of the mating speed of the first and second connector parts 100, 200 and the engagement speed of the first and second contacts 110, 210 in addition to a flushing of the contacts. Damage to the contacts 110, 210, during mating that may occur due to an excessive mating speed may thus be prevented.

The connector part 100 can be modified in several ways. As an example, only two, three or four bores 152 may be provided and may be positioned such that the mating faces of the first and second contacts 220, 210 are flushed shortly before they come into contact. In some embodiments, the flushing mechanism may not comprise a damper unit, and the body 20 may be fixedly mounted with respect to the connector housing 105, similar to the example of FIG. 1. In some configurations, the piston 12 may comprise the bores 152. In even other configurations, the body 20 may be moved by means of the shuttle pin 150, and the piston 12 may be fixed with respect to the connector housing 105. In some embodiments, no piston 12 may be provided, and the shuttle pin 150 may for example directly enter the chamber 30 to displace medium and effect the flushing. In even other configurations, the chamber 30 may be provided by a bellows or bladder that is compressed, directly or indirectly, by the mating force to expel medium for flushing.

Figure 8:
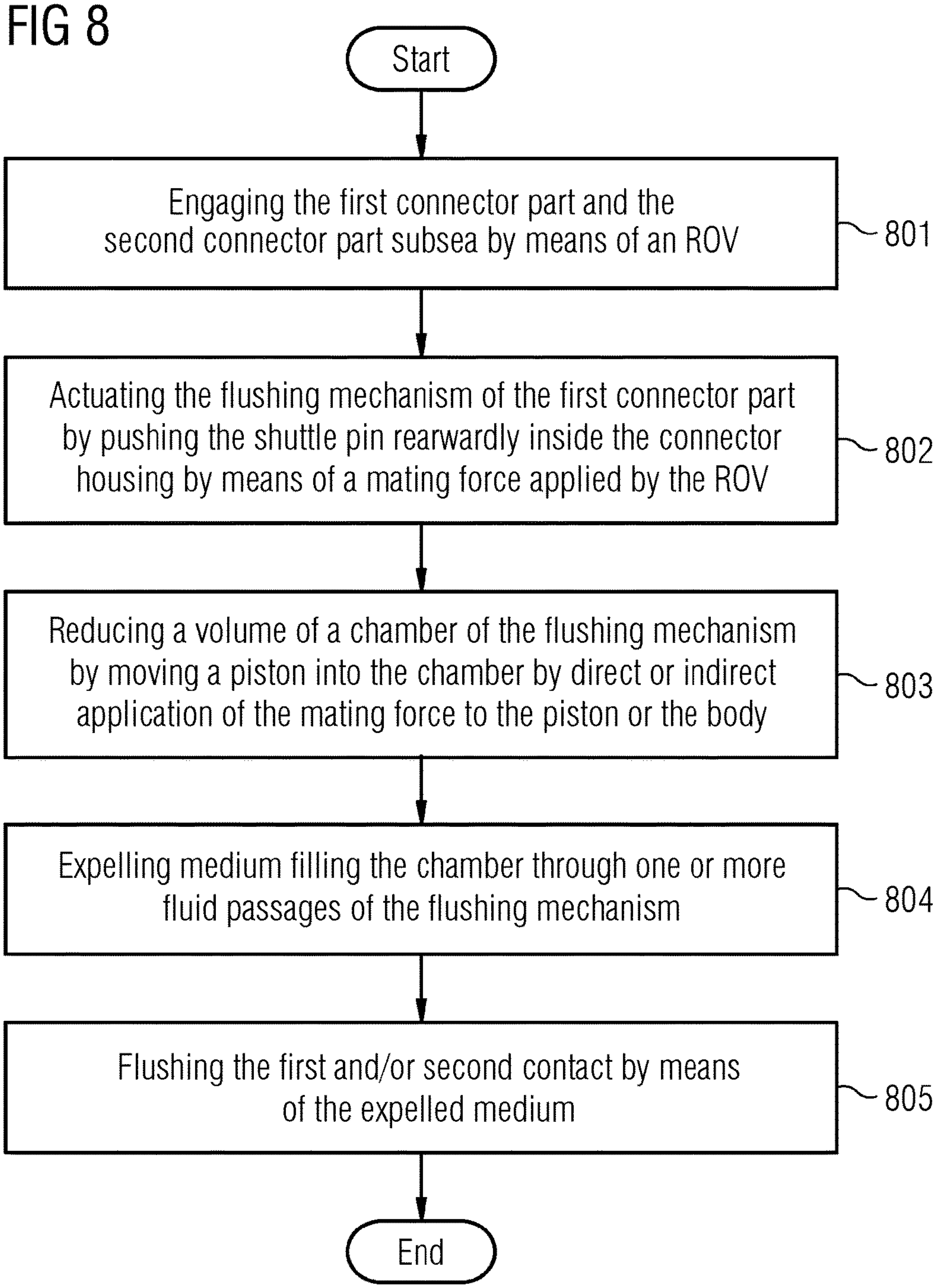
FIG. 8 is a flow diagram illustrating a method according to an embodiment of the invention.

FIG. 8 shows a flow diagram of a method according to an embodiment of the invention. In step 801, the first connector part 100 and the second connector part 200 are engaged at a subsea location by means of an ROV. As an example, the first connector part 100 may include an ROV handle which can be grabbed by the ROV. The second connector part 200 may be fixedly mounted to a support structure, for example to a subsea device or a frame, and the ROV may push the first connector part 100 into the second connector part 200, or vice versa.

By means of the mating force that is applied by the ROV, the pin 250 enters the first connector part 100, so that the pin 250 pushes the shuttle pin 150 rearwardly inside the connector housing 105, thereby actuating the flushing mechanism of the first connector part (step 802).

Actuating the flushing mechanism may include reducing a volume of a chamber 30 of the flushing mechanism by moving a piston 12 (or directly the shuttle pin 150) into the chamber 30 by direct or indirect application of the mating force to the piston 12 (or the shuttle pin 150) or the body 20 (step 803). Direct application of the mating force can include that the piston or shuttle pin is directly moved into the chamber 30, as illustrated in FIG. 1. Indirect application of the mating force includes configurations similar to the one described in FIGS. 5 to 7, where the mating force pretensions the spring 11 which in turn causes movement of the piston 12 into the chamber 30 (in the above described examples by causing a forward movement of the body 20). In these configurations, actuating the flushing mechanism may involve compressing the first spring 11.

As outlined above, other means for reducing a volume of a chamber of the first connector part may be provided, such as a bladder or bellows that is compressed in order to reduce its internal volume.

In step 804, medium filling the chamber is expelled through one or more fluid passages 32 of the flushing mechanism. It should be clear that the medium is expelled while the volume of the chamber is reduced in step 803, so that steps 803 and 804 are carried out substantially simultaneously. By the expelling of medium, the first and/or second contact 110, 210 is flushed. As mentioned above, the fluid passage 32 can for this purpose comprise one or more bores or ports that are oriented such that the expelled medium is directed towards the first and/or second contact 110, 210. Preferably, both contacts are flushed. Accordingly, any debris, particles, or other impurities that may be present in the medium filling the connector part 100 may be removed from the mating surface of the respective contact 110, 210. If the flushing action that is carried out by the flushing mechanism during the mating procedure is not sufficient to remove such impurities from the mating surface of the first or second contact, the first and second connector parts can be de-mated and can be mated again to perform a further flushing action. This can be repeated until the mating surfaces are clean and a reliable connection via the first and second contacts can be established that that does not suffer from reduced performance.

In summary, an internal flushing mechanism is provided in the first connector part which directs a jet of medium, in particular a dielectric liquid, such as compensating oil, over the face of the contact, such as a mating ferrule, wherein the jet of medium is generated by the mating operation. The flushing mechanism takes advantage of the mating force. The flushing mechanism is fitted as a permanent assembly within the first connector part. The flushing operation is performed post deployment, during the mating of the first connector part with the second connector part at the subsea location. In exemplary embodiments, the mating action forces a piston into the body of the flushing mechanism, thereby expelling medium from the internal chamber of the body through fluid passages, such as bleed ports, which are directed at the mating faces of the first and/or second contacts, such as the mating faces of a mating ferrule pair.

In practical application, if a poor or no optical signal after deployment and mating of the first and second connector parts is received through the connection established by the first and second contacts, the connector can be re-mated by the ROV, thus activating the flushing mechanism again, which produces a strong movement of the medium over the faces of the contacts, such as the mating ferrules. This way, the high financial costs associated with a recovery of a poorly performing connector can be avoided.

While specific embodiments are disclosed herein, various changes and modifications can be made without departing from the scope of the invention. The embodiments described herein are to be considered in all respects as illustrative and non-restrictive, and any changes coming within the meaning and equivalency range of the appended claims are intended to be embraced therein.

What is claimed is:

1. A connector part of a subsea connector adapted to be mated with a second part of the subsea connector by application of a mating force, wherein the connector part comprises:

at least a first optical or electrical contact configured for engagement with a respective second optical or electrical contact of the second part for establishing a respective optical or electrical connection; and a flushing mechanism comprising a chamber filled with a medium and one or more fluid passages providing a flow connection from the chamber to an area adjacent to the first contact, wherein the flushing mechanism is configured such that during mating of the connector part with the second part, the flushing mechanism is actuated by said mating force and the medium is expelled from the chamber and circulated within the connector part and is directed towards at least one of the first contact or the second contact so as to flush the first contact or the second contact, respectively, during mating of the first contact with the second contact.

2. The connector part according to claim 1, wherein the flushing mechanism is an internal flushing mechanism that is arranged inside a connector housing of the connector part.

3. The connector part according to claim 1, wherein the flushing mechanism comprises a piston that is arranged to be movable into said chamber during operation of the flushing mechanism so as to displace the medium from within said chamber.

4. The connector part according to claim 1, wherein the force for expelling medium from said chamber is directly or indirectly provided by the mating force which is applied to the connector part and/or the second part during mating.

5. The connector part according to claim 1, wherein the one or more fluid passages are arranged such that at least one fluid passage expels the medium in a direction that is substantially perpendicular to an axial direction of the connector part.

6. The connector part according to claim 1, wherein the one or more fluid passages are arranged such that the medium is expelled in a radially outwardly direction from a central axis of the connector part.

7. The connector part according to claim 1, wherein the flushing mechanism comprises a piston and a body enclosing said chamber, wherein said one or more fluid passages are provided in the piston, in the body, or in both.

8. The connector part according to claim 1, wherein the connector part includes a connector housing in which the flushing mechanism is arranged, wherein the connector housing is filled with a pressure compensation medium and is pressure compensated against a surrounding environment, wherein said medium that is expelled from said chamber is said pressure compensation medium.

9. The connector part according to claim 1, wherein said flushing mechanism comprises a piston and a body enclosing said chamber, and further comprises a flushing mechanism spring that is arranged to apply a spring force that counteracts a movement of the piston into the body.

10. The connector part according to claim 9, wherein the body is movable in the connector part between a first position in which the first contact engages the second contact when the connector part and the second part are in the mated state, and a second position in which the first contact is spaced apart from the second contact when the connector part and the second part are in the mated state, wherein the flushing mechanism further comprises a first spring that is mechanically connected to the body so as to urge the body into the first position, the flushing mechanism being configured such that during mating, the body and piston are displaced towards the second position by the mating force against the force of the first spring, and that in the second position, the first spring urges the body forwardly towards the piston and towards the first position against the force of the flushing mechanism spring, thereby decreasing the volume of said chamber and expelling medium through said one or more fluid passages.

11. The connector part according to claim 10, wherein the one or more fluid passages are dimensioned such that the flow of medium out of the chamber is restricted so as to delay the movement of the body towards the first position by the force applied by the first spring.

12. The connector part according to claim 1, wherein the connector part comprises a connector housing having an opening for allowing a pin of the second part to enter the connector part, and further comprises a shuttle pin that is disposed in said opening and sealed against the connector housing in an unmated state of the connector part, wherein the shuttle pin is movable rearwardly into the connector housing to activate the flushing mechanism during mating.

13. The connector part according to claim 12, wherein the shuttle pin is movable along a central axis of the connector part, wherein the first contact is disposed at a position that is radially displaced from the central axis and that allows the shuttle pin to travel towards an axial position at which it at least partly overlaps the first contact.

14. The connector part according to claim 12, wherein the shuttle pin comprises at least a part of the one or more flow passages.

15. The connector part according to claim 1, further comprising a damper unit configured to delay an engagement of the first contact with the second contact during the mating of the connector part with the second part.

16. A method of flushing a contact of a subsea connector, wherein the subsea connector comprises a first connector part having a first optical or electrical contact and a second connector part having a second optical or electrical contact, and wherein the first connector part comprises a flushing mechanism that includes a chamber filled with a medium and one or more fluid passages providing a flow connection from the chamber to an area adjacent to the first contact, wherein the method comprises:

mating the first connector part with the second connector part for engaging the first contact with the second contact for establishing an optical or electrical connection, wherein said mating occurs with a mating force; and actuating the flushing mechanism by said mating force, thereby expelling medium from the chamber, wherein the medium is circulated within the first connector part and is directed towards at least one of the first contact or the second contact so as to flush the first contact or the second contact, respectively, during mating of the first contact with the second contact.

* * * * *